United States Patent [19]
Ye et al.

[11] Patent Number: 6,009,888
[45] Date of Patent: Jan. 4, 2000

[54] PHOTORESIST AND POLYMER REMOVAL BY UV LASER AQUEOUS OXIDANT

[75] Inventors: Jian-Hui Ye; Yuan-Ping Lee; Mei-Sheng Zhou; Yong-Feng Lu, all of Singapore, Singapore

[73] Assignee: Chartered Semiconductor Manufacturing Company, Ltd., Singapore, Singapore

[21] Appl. No.: 09/073,946

[22] Filed: May 7, 1998

[51] Int. Cl.[7] .................................. B08B 7/00; B08B 7/04
[52] U.S. Cl. ..................................... 134/1.3; 134/2; 134/3
[58] Field of Search .............................. 134/1, 1.3, 2, 3; 438/746; 216/94; 252/79.2; 510/176

[56] References Cited

U.S. PATENT DOCUMENTS

| | | | |
|---|---|---|---|
| 4,718,974 | 1/1988 | Minaee | 156/643 |
| 5,035,918 | 7/1991 | Vyas | 427/53.1 |
| 5,114,834 | 5/1992 | Nachshon | 430/329 |
| 5,381,807 | 1/1995 | Lee | 134/2 |
| 5,630,904 | 5/1997 | Aoyama et al. | 438/669 |

OTHER PUBLICATIONS

Livshits et al, "Laser, Dry And Plasmaless Photoresist Removal", Solid State Technology, Jul. 1997, p. 197–202.

*Primary Examiner*—Randy Gulakowski
*Assistant Examiner*—Alexander Markoff
*Attorney, Agent, or Firm*—George O. Saile; Stephen B. Ackerman; William J. Stoffel

[57] ABSTRACT

A method of stripping photoresist and polymer from a wafer after a dry etch of a nitrade or a polysilicon layer that immerses the wafer in a peroxydisulfate ($S_2O_8^{2-}$)/HCl wet bath and while the wafer is still immersed, irradiates the wafer with a UV laser. The method comprises: (a) forming an silicon nitride layer 24 and a photoresist pattern 28 over a semi conductor structure 10; (b) dry etching the silicon nitride layer 24 thus forming a polymer 30 over the photoresist pattern, and the silicon nitride layer, (c) Immersing the substrate, the photoresist pattern, the polymer 30 in a liquid bath 34 comprising (1) peroxydisulfate ($S_2O_8^{2-}$), (2) HCl, and (3) water; and irradiating the photoresist pattern 28 and polymer layer 30 with a UV laser thereby removing the photoresist 28 and polymer 30.

10 Claims, 3 Drawing Sheets

PHOTORESIST AND POLYMER REMOVAL BY UV LASER AQUEOUS OXIDANT

BACKGROUND OF THE INVENTION

1) Field of the Invention

This invention relates generally to the removal of photoresist from a semiconductor wafer and more particularly to a process for removing photoresist and a polymer using an aqueous oxidant bath (e.g., aqueous peroxydisulfate in HCl) and simultaneous UV laser irradiation.

2) Description of the Prior Art

The semiconductor industry is driven by the constant need to make smaller and denser devices with greater complexity. Advances in photolithography drive semiconductor miniaturization. Tough challenges to microlithography and, consequently, in photoresist stripping are created by this miniaturization. Present fabrication technology is capable of dealing with device feature sizes of 0.35 $\mu$m, but the critical dimensions of ICs are expected to approach 0.18 $\mu$m by the year 2000. The anticipated reduction in dimensions requires considerable changes in manufacturing technologies, including the stripping process.

Two main photoresist stripping methods are used in the semiconductor fabrication industry: (1) Dry stripping uses mostly plasma, and to a lesser extent, $O_3$, $O_3/N_2O$, or UV/$O_3$-based stripping; and (2) Wet stripping uses acids such as $H_2SO_4/H_2O_2$ (Piranha) or organic solvents.

Dry stripping using reactive plasma ashing, suffers from drawbacks from incomplete removal of photoresist and resist popping. Plasma ashing is also associated with several types of damage mechanisms introduced or aggravated by the plasma. These damage mechanisms are due to charges, currents, electric-field-induced UV radiation, contamination (such as alkali ions, heavy metals, and particulates), and elevated temperatures. Resist removal is often incomplete, especially after "tough" processing such HDP and RIE, where the photoresist undergoes chemical and physical changes and forms hard sidewalls. Since plasma ashing often leaves residues, a wet strip must follow to complete the stripping process. In many cases, to avoid alkali and heavy metals contamination, the plasma ashing is stopped before the endpoint, and the wafer is transferred to a wet bath.

For the second stripping method, the wet-stripping method, disadvantages include solution concentrations that change with the number of wafers being stripped, thus affecting stripping quality and throughput; accumulation of contaminants in the baths, which drastically affects yield; and severely corrosive and toxic solutions that impose high handling and disposal costs and create serious safety considerations. Other wet-stripping problems are due to mass transport and surface tension associated with the solutions. For deep sub micron technologies, the solutions cannot circulate and tend to accumulate within the patterned structure. This situation is intolerable, as it contaminates the wafer with foreign materials that can lead to drastic yield losses. All of these wet-stripping problems will become even more critical for 300 + mm wafers.

The inventor has found that a major problem with conventional photoresist strip processes is the incomplete removal of photoresist and hydrocarbon residual polymers, formed during the dry etching of silicon nitride. These polymers form over the photoresist and in narrow spaces and holes. These polymers create defects if the polymers and photoresist are not completely removed before the next process step. Therefore there is a need for an improved photoresist and polymer removal process that can remove the both the tough polymer residues formed during nitride dry etching and the photoresist.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,035,918(Vyas): *Non-Flammmable And Strippable Plating Resist And Method Of Using Same*—shows a method of removing resist using a controlled excimer laser pulse to remove such resist within the areas by an ablation process or a "patch blow off" energy efficient process. U.S. Pat. No. 5,381,807(Lee) shows a method of striping resists and polymers using hydroxylamine and alkanolamine. U.S. Pat. No. 5,630,904(Aoyama) shows a method of striping resists using an organocarboxylic. U.S. Pat. No. 5,114,834 (Nachshon) shows a PR removal process using UV ablation. U.S. Pat. No. 4,718,974(Minaee) shows a photoresist stripping apparatus using a UV lamp.

The article "Laser, Dry And Plasmaless Photoresist Removal", by Livshits et al., Solid State Technology, July 1997, pp. 197–202. discusses laser ablation with a plasmaless dry chemistry.

However, these photoresist strip methods can be further improved.

SUMMARY OF THE INVENTION

It is an object of the present invention to provide a method for removing photoresist by immersing the wafer in a strong aqueous oxidant ($S_2O_8^{2-}$) and a directing a UV laser onto the wafer thereby depolymerizing and removing the photoresist.

It is an object of the present invention to provide a method for removing photoresist and polymer residues after a RIE etch by immersing the wafer in a strong aqueous oxidant ($S_2O_8^{2-}$) and irradiating the wafer using a UV laser thereby depolymerizing the photoresist and polymer residues.

It is an object of the present invention to provide a method for removing photoresist and polymer residues after a RIE etch of a silicon nitride layer by immersing the wafer in a strong aqueous oxidant ($S_2O_8^{2-}$) and a directing a UV laser onto the wafer thereby depolymerizing the photoresist and polymer residues.

To accomplish the above objectives, the present invention provides a method of stripping photoresist and polymer from a wafer that uses a simultaneous a wet strong aqueous oxidant ($S_2O_8^{2-}$/HCl) immersion and UV laser irradiation.

The method of removing photoresist over a semiconductor structure comprising the steps of:

(1a) forming a photoresist pattern over a semiconductor structure;

(1b) immersing said substrate in a bath comprising (a) peroxydisulfate ($S_2O_8^{2-}$) (bisulfate), (2) hydrochloric acid (HCl) and (3) water; and agitating said semiconductor structure in said solution; said bath at a temperature in a range of between about 90 and 100° C.;

(1c) irradiating said semiconductor structure, and said photoresist pattern with a UV laser with a wave length between about 150 nm and 300 nm, and with an energy between about 4 and 8.0 eV and laser pulses in a range of between about 10 and 10,000 per wafer to remove said photoresist.

The process of the invention is in general used to remove photoresist over a wafer. The process of the invention is particularly successful in removing photoresist and polymers from:

over a Silicon nitride ($Si_3N_4$ or SiN) layer after a RIE etch, especially when the Polymer contains metals. FIGS. 1–3.

over a bottom anti-reflective coating (BARC) and silicon nitride layer after a dry etch. See FIGS. 4 to 6.

over a polysilicon layer after a RIE etch, especially when the Polymer contains metals.

The Polymer and hardened photoresist formed from dry etches is removed by the invention's stripping process.

The invention can be applied to DUV PR and BARC as described in FIG. 4 to 6.

The invention can also be used to strip photoresist and polymer after various etches of polysilicon.

One of the novel properties of the invention is that $S_2O_8^{2-}/HCl/H_2O$ has a very high redox potential (2.01 V vs NHE) which is quite close to that of ozone (2.07 V vs NHE). Moreover, the invention's aqueous $S_2O_8^{2-}$ provides better contact area than gas and is more efficient in the UV laser strip process.

The combination Acid bath and Laser irradiation provides an unexpected improvement (synergy) in the removal of photoresist and polymer beyond that expected for using the acid bath in sequence(before and/or after the UV laser) with the UV laser.

The strip process of the invention is particularly suited for stripping polymers formed with a nitride RIE etch. The polymers often contain metal-incorporated polymers which can not be removed by the prior art strip process.

The present invention achieves these benefits in the context of known process technology. However, a further understanding of the nature and advantages of the present invention may be realized by reference to the latter portions of the specification and attached drawings.

BRIEF DESCRIPTION OF THEIR DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1–3 show photoresist stripped after a $Si_3N_4$ etch.

FIGS. 4 to 6 show a photoresist strip after a BARC/$Si_3N_4$ etch.

DETAILED DESCRIPTION OF THE PREFERRED EMBODIMENTS

Figure 1:
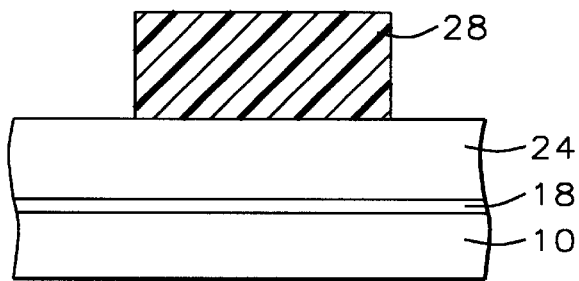
FIGS. 1 through 3 are cross sectional views for illustrating a method for stripping photoresist from a wafer according to the present invention.

The present invention will be described in detail with reference to the accompanying drawings. In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not be described in detail in order to not unnecessarily obscure the present invention.

The invention provides a one step method of removing photoresist and polymer by: immersing a wafer with photoresist in a wet etch having a strong oxidizing agent and irradiating the wafer and photoresist with a UV laser.

General Scope of the Invention's Photoresist Strip Method

In general, the process of the invention can be used to remove photoresist over a wafer. The process of the invention is particularly successful in removing photoresist and polymers over a $Si_3N_4$ layer after a RIE etch, especially when the Polymer contains metals. (See FIGS. 1–3). In addition, the process of the invention is particularly successful at removing photoresist and polymers from over a polysilicon layer after a RIE etch, especially when the Polymer contains metals. The invention is also successful a removing photoresist, bottom anti-reflective coating (BARC) and polymer over a silicon nitride layer after a dry etch. See FIGS. 4 to 6. The invention be used to remove photoresist after etches other than RIE etches, such as wet etches.

The invention's strip process should not be used to remove photoresist after an via or contact (oxide) etch where a oxidizable metal is exposed because the oxidant bath will attack the exposed metal. That is the invention's oxidizing bath (Peroxydisulfate ($S_2O_8^{2-}$) (bisulfate), an acid (e.g., HCl)) and water) can attack some metals and cause yield problems. However the invention can be used remove photoresist after a polysilicon etch because the etch (passivation) does not affect device performance.

The inventor has found that the $S_2O_8^{2-}/HCl/H_2O$ bath facilitates decomposition of the photoresist and the polymer. The $HCl/H_2O$ dissolves products from the RIE Etch. This wet bath/UV laser photoresist removal effect is a synergistic effect that is superior to conventional photoresist strip processes at removing polymers over photoresist layers.

The table below lists the elements shown in the figures.

TABLE OF ELEMENTS IN FIGURES

| Element | Remarks |
| --- | --- |
| 10 | P or n-type silicon substrate |
| 18 | thermal silicon oxide (pad oxide) |
| 24 | CVD or LPCVD silicon nitride |
| 28 | positive photoresist |
| 30 | polymers |
| 32 | RIB plasma etch |
| 36 | UV laser ablation with a peroxydisulfate $S_2O_8^{2-}$, HCl and $H_2O$ |
| 42 | thermal silicon oxide (pad oxide) |
| 44 | CVD or LPCVD silicon nitride |
| 46 | organic or inorganic BARC |
| 48 | (positive) photoresist |
| 50 | polymers |
| 52 | RIB plasma etch |
| 56 | UV laser ablation with a peroxydisulfate $S_2O_8^{2-}$, HCl and $H_2O$ |
| 108 | wet bath/UV laser strip tool |
| 110 | Laser Gun free to move in angular and XY direction |
| 111 | Laser Radiation |
| 112 | Quartz Lens |
| 113 | Chemical Sink with Aqueous Reagents |
| 114 | Rotable Stage |
| 115 | Treatment Wafer with photoresist |
| 116 | x-y movement of laser gun |
| 118 | angular movement of the laser gun |
| 120 | rotation movement of the rotatable stage 114 |

First Embodiment—Removing Photoresist After A $Si_3N_4$ Etch

FIG. 1 shows the forming of a silicon nitride layer 24 over a semiconductor structure 10. Semiconductor structure 10 is understood to possibly include a semiconductor wafer, active and passive devices formed within the wafer and layers formed over the wafer surface. The term "semiconductor structure" is mean to include devices formed within a semiconductor wafer and the layers overlying the wafer. For example, the configuration shown in FIG. 1 can include layers formed between the wafer and the oxide layer 18.

A preferred process step using the stripping process of the invention is the etching and photoresist stripping after the $Si_3N_4$ etch in defining the regions to form isolation (such as shallow trench isolation (STI) or field oxide (fox).

The pad oxide layer 18 is preferably formed of silicon oxide.

The silicon nitride ($Si_3N_4$) layer 24 is preferably formed using an LPCVD process. The silicon nitride can be formed by any known Silicon nitride process.

Referring to FIG. 1, a photoresist pattern 28 is formed over the silicon nitride layer 24. The photoresist pattern 28 has first openings exposing portions of the silicon nitride layer. The photoresist can be any type of photoresist or combinations of photoresist, such as Positive, negative, DUV photoresist or bottom anti-reflective coating (BARC).

The photoresist pattern 28 is formed by forming a photoresist layer and exposing and developing the layer. The photoresist pattern 28 preferably has a thickness in a range of between about 5000 and 15000 Å.

Figure 2:
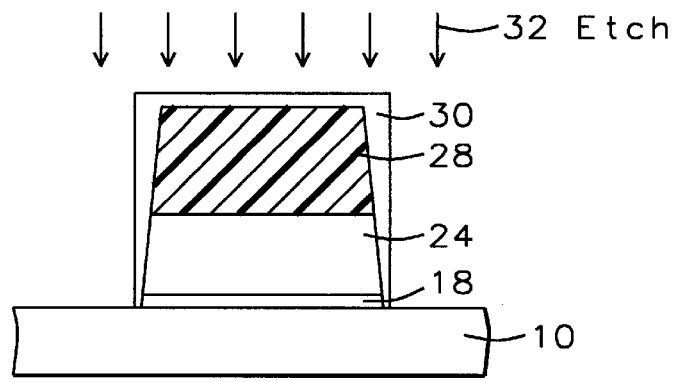

FIG. 2 shows the etching of the silicon nitride layer 24 using a dry etch. An etch that generates a hard photoresist layer and polymers 30 and other metal contaminates is a RIE etch, using for example $CHF_3/CF_4$ or $CHF_3/CF_4/CO$.

The inventor surmises that the polymers 30 are created in the dry etch by the $CHF_3$ and CO gasses. Some of the polymers may be from an oxide layer 18. A dry etch using CO has been found by the inventor to create polymer that is especially hard to remove.

This etch thus forms a polymer layer 30 over the photoresist pattern 28 and the silicon nitride layer 24. The polymers layer 30 typically is composed of hydrocarbons and the polymer layer having a thickness in a range of between about 10 and 500 Å. Removing this polymer layer 30 is an added obstacle for the invention's strip. However, the invention will work even better if no polymer layer is present.

Figure 3:
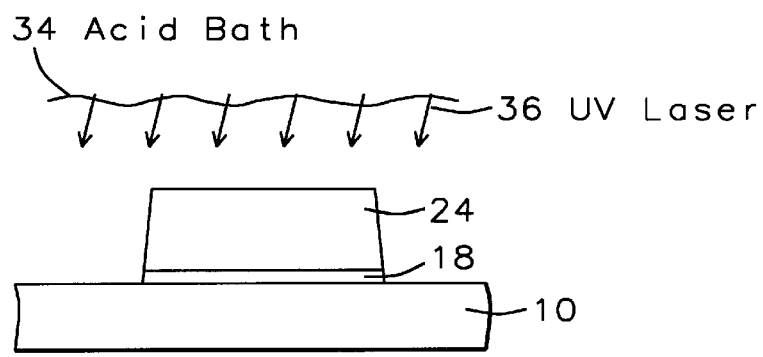
Figure 7:
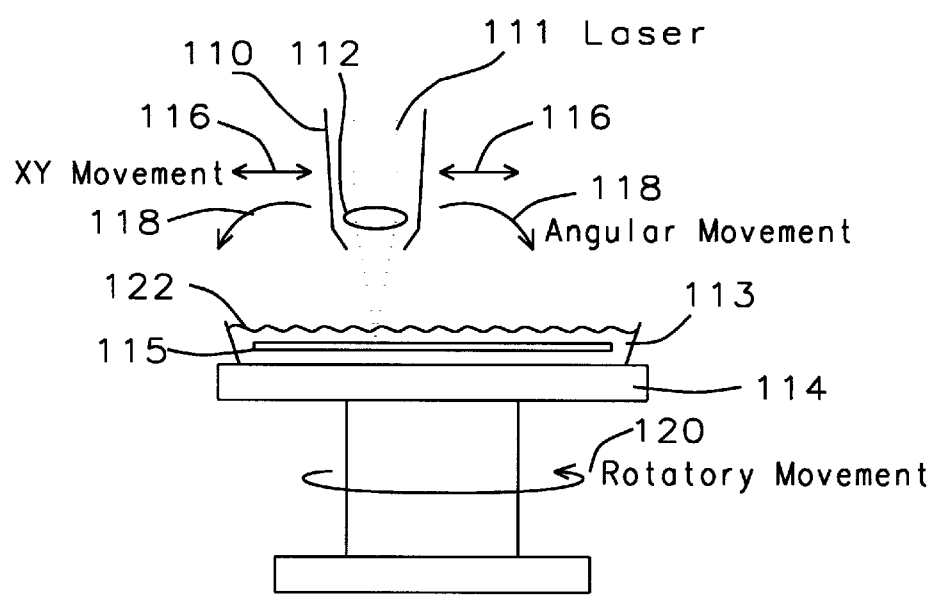
FIG. 7 is an illustration of a tool used to perform the strip process of the invention.

FIGS. 3 and 7 show that the photoresist pattern 28 and polymer layer 30 are immersed in a wet bath 34 containing aqueous peroxydisulfate $S_2O_8^{2-}$, HCl and $H_2O$ and then the wafer, polymer and photoresist are irradiated 36 with UV light, preferably from a UV laser. The oxidizing bath 34 and UV layer ablates the PR pattern 28 and the polymer 30. Also see FIG. 7.

The UV laser 111 preferably has a wave length between about 150 nm and 300 nm and more preferably between 193 nm and 253.7 nm, with energy between about 4.0 and 8.0 eV., with between about 10 and 10,000 laser pulses per wafer (e.g., controlled excimer laser pulses), to at least partially remove the polymer and photoresist. The laser is set to an energy range where the polymer layer is removed while not damaging the underlying layers or substrate.

TABLE

Preferred parameters for the UV Laser irradiation

| UV laser Parameters | units | low Limit | upper limit |
|---|---|---|---|
| wavelength | nm | 150 (8 ev) | 300 (4 ev) |
| energy | J | 0.05 | 2 |
| Peak power | MWatts | 3 | 50 |

TABLE-continued

Preferred parameters for the UV Laser irradiation

| UV laser Parameters | units | low Limit | upper limit |
|---|---|---|---|
| Pulsed -yes Average power preferred type of laser - excimer laser with $F_2$, ArF, KrCl, KrF, XeCl. | Watts | 3 | 200 |
| Pulse duration time period | nsec | 10 | 30 |
| frequency of laser pulses | Hz | 1 Hz | 10,000 Hz |
| Pressure | torr | 0.005 | 1000 |

An UV lamp probably will not be optimum for the invention. Coherent light sources normally attain higher cleaning efficiency. However, the UV lamp shown in U.S. Pat. No. 4,718,974 (Minaee) (e.g., Microwave energized UV light source) is suitable for the invention. The invention preferably uses an excimer laser with $F_2$, ArF, KrCl, KrF, or XeCl. As FIGS. 3 and 7 show, the angle of the laser is changed (or rotated) so the laser strikes all surfaces of the structure 24 44 so that all the polymer and photoresist are removed. Changing the angle of the laser is critical to removing all the photoresist and polymer from an irregular surface. This is a major improvement over a non-movable/angling laser irradiation treatment. The laser can be scanned across the wafer surface and various passes made at different angles.

FIG. 3 shows removing the remaining portions of the photoresist pattern and the polymer by immersing the substrate in a bath and irradiation with UV laser. The bath 34 preferably comprises: (a) peroxydisulfate ($S_2O_8^{2-}$) (bisulfate), (2) an acid (hydrochloric acid—HCl)) and (3) water. The substrate is immersed in the bath and preferably agitated. The bath preferably has at a temperature in a range of between about 90 and 100° C. Preferred concentration ranges for the invention's $S_2O_8^{2-}$/HCl/$H_2O$ bath are as shown below:

| | concentration units | Low | High |
|---|---|---|---|
| $S_2O_8^{2-}$ | mM | 1 | 100 |
| HCl | M | 0.1 | 1 |

The wet aqueous bath of the invention using a strong oxidant to remove the polymer 30 and photoresist polymers. The Aqueous peroxydisulfate in acid is a strong oxidant that facilitates the decomposition of the polymers. Since the electrochemical potential of peroxidulfate is 2.01 V vs NHE.

$S_2O_8^{2-}+2e=2SO_4^{2-}$ $E°=2.01$ V vs NHE. (Equation 1)

HCl is used to complex the possible metallic species during nitride etch and dissolve non-volatile by products.

The wafer can then be cleaned DI water and IPA baths after the laser ablation/$S_2O_8^{2-}$.

Striping Photoresist After A Polysilicon Etch

The acid bath/UV laser strip method of the invention can be used to strip photoresist and polymer from over a polysilicon layer (after an etch of the polysilicon layer). For examples, in FIGS. 1 through 3, the layers 18 and 24 can represent a polysilicon layer. The invention's acid bath/UV laser strip method to remove photoresist over a polysilicon layer is the same as described above for removing photoresist over a silicon nitride layer.

Second Embodiment—Stripping Method for Photoresist, BARC and Polymer

Figure 4:
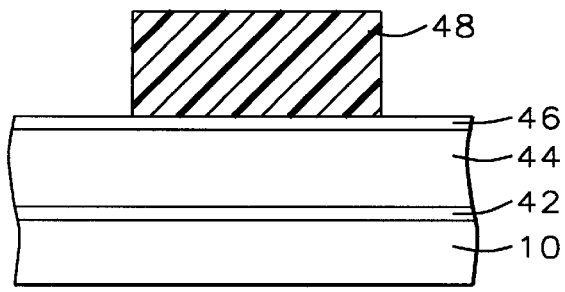
FIGS. 4 through 6 are cross sectional views for illustrating a method for stripping photoresist from a wafer according to the present invention.
Figure 5:
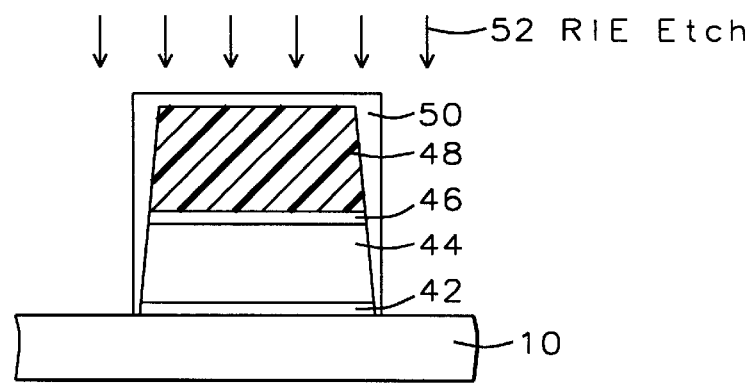
Figure 6:
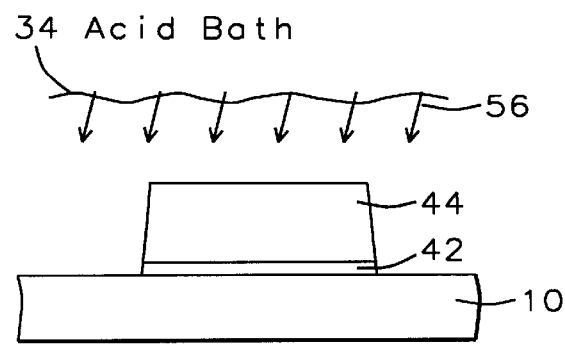

FIGS. 4 through 6 show the second embodiment of the invention's Stripping method for photoresist 48, bottom anti-reflective coating (BARC) 46 and polymer 50.

FIG. 4 shows a semiconductor structure 10 (e.g., wafer) with an overlying thermal silicon oxide (pad oxide) 42, CVD or LPCVD silicon nitride layer 44, organic or inorganic bottom anti-reflective coating (BARC) layer 46, (e.g., positive) photoresist layer 48.

FIG. 5 show a RIE etch 52 of the silicon oxide (pad oxide) 42, silicon nitride layer 44, and organic or inorganic BARC layer 46 (e.g., TiN) using the photoresist as an etch mask. The RIE etch forms the polymer layer 50 over the structure.

FIG. 6 shows the wafer 10 immersed in an acid bath 34 (aqueous peroxydisulfate $S_2O_8^{2-}$, HCl and $H_2O$). The wafer, while still immersed in bath 34 is irradiated with UV light 56, preferably from a UV laser. As FIG. 6 shows, the angle of the laser is changed (or rotated) so the laser strikes all surfaces of the structure 24 44 so that all the polymer and photoresist are removed. The UV and bath parameters are explained above.

Acid Bath/UV Laser Stripping Tool

FIG. 7 shows the acid bath/UV laser stripping tool 108 of the invention. The Laser Gun 110 and holding mechanism for the laser gun (not shown) are designed to move in angular and xy direction 116. This way the laser can irradiated all the photoresist and Polymer on the various angled surfaces of the wafer and layers over the wafer. The Laser Radiation 111 is preferably focused through a lenses (e.g., Quartz Lens) 112. The Treatment Wafer 115 is immersed in the Chemical Sink 113 with Aqueous Reagents 122. The reagents 122 are preferably agitated by rotary movement 120 by a rotating Stage 114.

The invention provides the following benefits:

easy 1 step-wet oxidizing bath immersion and UV laser irradiation that removes photoresist and polymer without plasma damaging underlying layers (e.g., $Si_3N_4$ layers).

The polymer 30 and hardened photoresist formed from dry etches is removed by the invention's stripping process.

The invention can be applied to DUV PR and BARC as described in FIG. 4 to 6.

The invention can also be used to strip photoresist and polymer after various RIE etch of poly-Si.

One of the novel properties of the invention is that $S_2O_8^{2-}/HCl/H_2O$ has a very high redox potential (2.01 V vs NHE) which is quite close to that of ozone (2.07 V vs NHE). However, aqueous $S_2O_8^{2-}$ provides better contact area than oxidizing gas and is more efficiently in the UV laser strip process.

The combination Acid bath and Laser irradiation provides an unexpected improvement & synergy in the removal of PR and polymer beyond that expected for using the acid bath in sequence(before and/or after the UV laser) with the UV laser.

The strip process of the invention is particularly strong at stripping polymers formed with an active nitride RIE etch. The polymers often contain metal-incorporated polymers which can not be removed by the prior art strip process.

The acid bath of the present invention is less hazardous to handle compared to $H_2SO_4/H_2O_2$.

The strip of the invention has been found to be more effective than the laser and dry photoresist removal process described in the article "Laser, Dry And Plasmaless Photoresist Removal", by Livshits et al., Solid State Technology, July 1997-197-202. The invention's process has been found more effective in removing non-volatile polymers (especially with metal incorporated) after RIE etches and in particular after silicon nitride RIE etches. The invention is superior at effectively removing the polymers and photoresist.

It should be recognized that many publications describe the details of common techniques used in the fabrication process of integrated circuit components. See, E.g., C. Y. Chang, S. M. Sze, in *ULSI Techntology*, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of removing photoresist comprising the steps of:

(a) forming a photoresist pattern over a semiconductor structure;

(b) immersing said semiconductor structure in a bath comprising (1) peroxydisulfate ($S_2O_8^{2-}$), (2) hydrochloric acid (HCl) and (3) water;

(c) while immersed in said bath, irradiating said semiconductor structure and said photoresist pattern with UV laser irradiation thereby removing said photoresist pattern.

2. The method of claim 1 wherein said bath is agitated; and said bath has a temperature in a range of between about 90 and 100° C.

3. The method of claim 1 wherein before step (b) further includes forming an oxide layer over said semiconductor structure
   forming a silicon nitride layer over said oxide layer;
   forming said photoresist pattern over said silicon nitride layer; said photoresist pattern having first openings exposing portions of said silicon nitride layer; and
   etching said silicon nitride layer using a dry etch thus forming a polymer layer over said photoresist pattern, and said silicon nitride layer; the dry etch of said silicon nitride layer performed with of a gas mixture selected from a group consisting of: $CHF_3/CF_4$ and $CHF_3/CF_4/CO$; and said polymer layer composed of hydrocarbons and said polymer layer having a thickness in a range of between about 10 and 500 Å; said polymer layer having metals incorporated therein.

4. The method of claim 1 wherein before step (b) further includes:

forming an oxide layer over said semiconductor structure;
   forming a silicon nitride layer over said oxide layer;
   forming a bottom anti-reflective coating (BARC) layer over said silicon nitride layer;

forming said photoresist pattern over said bottom anti-reflective coating (BARC) layer; said photoresist pattern having first openings exposing portions of said bottom anti-reflective coating (BARC) layer;

etching at least said bottom anti-reflective coating (BARC) layer, said silicon nitride layer using a dry etch thus forming a polymer layer over said photoresist pattern, and said silicon nitride layer.

5. The method of claim 1 wherein before step (b) further includes:

forming an oxide layer over said semiconductor structure;

forming a silicon nitride layer over said oxide layer;

forming a bottom anti-reflective coating (BARC) layer over said silicon nitride layer;

forming said photoresist pattern over said bottom anti-reflective coating (BARC) layer; said photoresist pattern having first openings exposing portions of said bottom anti-reflective coating (BARC) layer;

etching at least said bottom anti-reflective coating (BARC) layer, said silicon nitride layer using a dry etch thus forming a polymer layer over said photoresist pattern, and said silicon nitride layer; said dry etch of said silicon nitride layer performed with of a gas mixture selected from a group consisting of: $CHF_3/CF_4$ and $CHF_3/CF_4/CO$; and said polymer layer composed of hydrocarbons and said polymer layer having a thickness in a range of between about 10 and 500 Å; said polymer layer having metals incorporated therein.

6. The method of claim 1 wherein before step (b) further includes:

forming a polysilicon layer over said semiconductor structure;

forming said photoresist pattern over said polysilicon layer; said photoresist pattern having first openings exposing portions of said polysilicon layer;

etching said polysilicon layer using a dry etch thus forming a polymer layer over said photoresist pattern.

7. A method of removing photoresist comprising the steps of:

forming a photoresist pattern over a semiconductor structure;

immersing said semiconductor structure in a bath comprising (1) aqueous peroxydisulfate ($S_2O_8^{2-}$), (2) hydrochloric acid (HCl) and (3) water; said bath is agitated; and said bath has at a temperature in a range of between about 90 and 100° C.; $S_2O_8^{2-}$ at a concentration in a range between about 1 mM and 100 mM; and HCl at a concentration in a range of between about 0.1 M and 1 M;

while immersed in said bath, irradiating said semiconductor structure and said photoresist pattern with UV laser irradiation thereby removing said photoresist pattern; said UV laser is a excimer laser of a type selected from a group consisting of $F_2$, ArF, KrCl, KrF, and XeCl.

8. A method of removing photoresist and polymer comprising the steps of:

forming an oxide layer over a semiconductor structure;

forming a silicon nitride layer over said oxide layer;

forming a photoresist pattern over said silicon nitride layer; said photoresist pattern having first openings exposing portions of said silicon nitride layer;

etching said silicon nitride layer using a dry etch thus forming a polymer layer over said photoresist pattern, and said silicon nitride layer;

immersing said semiconductor structure in a bath comprising (1) peroxydisulfate ($S_2O_8^{2-}$), (2) hydrochloric acid (HCl) and (3) water; agitating said semiconductor structure in said bath; said bath being at a temperature in a range of between about 90 and 100° C.; and while said semiconductor structure is immersed in said bath, irradiating said semiconductor structure, and said photoresist pattern with a UV laser radiation with a wavelength between about 150 nm and 300 nm, and with an energy between about 4 ad 8.0 eV and laser pulses in a range of between about 10 and 10,000 per said semiconductor structure thereby removing said polymer and said photoresist pattern.

9. The method of claim 8 wherein the dry etch of said silicon nitride layer performed with of a gas mixture selected from a group consisting of $CHF_3/CF_4$ and $CHF_3/CF_4/CO$; and said polymer layer is composed of hydrocarbons and said polymer layer having a thickness in a range of between about 10 and 500 Å; said polymer layer having metals incorporated therein.

10. The method of claim 8 wherein said UV laser is an excimer laser using a gas selected from the group consisting of $F_2$, ArF, KrCl, KrF, and XeC.

* * * * *